(12) United States Patent
Bellaouar et al.

(10) Patent No.: US 8,509,290 B2
(45) Date of Patent: Aug. 13, 2013

(54) CLOSED-LOOP DIGITAL POWER CONTROL FOR A WIRELESS TRANSMITTER

(75) Inventors: Abdellatif Bellaouar, Richardson, TX (US); Tajinder Manku, Waterloo, CA (US)

(73) Assignee: Icera Canada ULC, Calgary (CA)

( * ) Notice: Subject to any disclaimer, the term of this patent is extended or adjusted under 35 U.S.C. 154(b) by 1088 days.

(21) Appl. No.: 12/520,448

(22) PCT Filed: Dec. 21, 2007

(86) PCT No.: PCT/CA2007/002352
§ 371 (c)(1),
(2), (4) Date: Jun. 19, 2009

(87) PCT Pub. No.: WO2008/074158
PCT Pub. Date: Jun. 26, 2008

(65) Prior Publication Data
US 2010/0027596 A1    Feb. 4, 2010

Related U.S. Application Data

(60) Provisional application No. 60/871,306, filed on Dec. 21, 2006.

(51) Int. Cl.
*H04B 1/38* (2006.01)

(52) U.S. Cl.
USPC ........ 375/219; 375/297; 375/318; 455/127.3; 455/127.4; 455/144; 455/240.1; 455/114.3; 455/311; 455/341; 330/85; 330/254; 330/256; 330/260; 330/10

(58) Field of Classification Search
USPC ........... 375/219, 297, 318; 455/127.3, 127.4, 455/144, 240.1, 114.3, 311, 341; 330/85, 330/254, 256, 260, 10
See application file for complete search history.

(56) References Cited

U.S. PATENT DOCUMENTS

| 5,675,611 A | 10/1997 | Lehtinen et al. |
| 5,819,165 A | 10/1998 | Hulkko et al. |

(Continued)

FOREIGN PATENT DOCUMENTS

| EP | 0416613 B1 | 8/1995 |
| EP | 0688109 A2 | 12/1995 |

(Continued)

OTHER PUBLICATIONS

PCT/CA2007/002352, International Search Report and Written Opinion, 11 pages, Apr. 17, 2008.

(Continued)

*Primary Examiner* — Daniel Washburn
*Assistant Examiner* — Rahel Guarino

(57) ABSTRACT

A closed loop power output calibration system for variable power output wireless devices. The wireless device includes a wireless transceiver having a transmit core coupled to a discrete power amplifier. Power detection circuitry formed in the wireless transceiver provides a detected power level of the power amplifier, and a reference power level, both of which are converted to digital signals using existing I and Q signal analog to digital converters in the receiver core. The digital signals are processed to cancel power distortion and temperature effects to provide a resulting power feedback signal. Corrective control signals are generated in response to the power feedback signal relative to a desired power output level. The gain in the transmit core is then adjusted in response to the corrective control signals such that the power amplifier outputs the target output power level.

19 Claims, 7 Drawing Sheets

(56) References Cited

U.S. PATENT DOCUMENTS

| | | |
|---|---|---|
| 6,253,092 B1 | 6/2001 | Nguyen et al. |
| 6,304,749 B1 | 10/2001 | Obara |
| 6,657,492 B1 | 12/2003 | Perthold et al. |
| 6,842,127 B2 | 1/2005 | Lagoguez et al. |
| 7,496,375 B2 | 2/2009 | Matsumoto |
| 2006/0232332 A1 | 10/2006 | Braithwaite |
| 2007/0176681 A1 | 8/2007 | Matsumoto |

FOREIGN PATENT DOCUMENTS

| | | |
|---|---|---|
| EP | 1289127 | 3/2003 |
| JP | 5-235786 A | 9/1993 |
| JP | 05235786 A | 9/1993 |
| JP | 8084113 A | 3/1996 |
| JP | 8-223075 A | 8/1996 |
| JP | 8223075 A | 8/1996 |
| JP | 11-136057 A | 5/1999 |
| JP | 11136057 | 5/1999 |
| JP | 11-308126 A | 11/1999 |
| JP | 11308126 A | 11/1999 |
| JP | 2001-339317 A | 12/2001 |
| JP | 2001339317 A | 12/2001 |
| JP | 2002-94394 A | 3/2002 |
| JP | 2002094394 A | 3/2002 |
| JP | 2004-260253 A | 9/2004 |
| JP | 2004260253 A | 9/2004 |
| JP | 2005-229274 A | 8/2005 |
| JP | 2005229274 A | 8/2005 |
| WO | 01/11769 | 2/2001 |

OTHER PUBLICATIONS

PCT/CA2007/002352, International Preliminary Report on Patentability, 7 pages, Jul. 2, 2009.

European Patent Office, Extended European Search Report, EP 07 85 5632, dated Apr. 29, 2011, 13 pages, Munich, Germany.

Translation of Japanese Office Action dated May 15, 2012, Application No. 2009-541721, 6 pages.

CLOSED-LOOP DIGITAL POWER CONTROL FOR A WIRELESS TRANSMITTER

CROSS REFERENCE TO RELATED APPLICATIONS

This application claims the benefit of priority of U.S. Provisional Patent Application No. 60/871,306 filed on Dec. 21, 2006, the contents of which are incorporated herein by reference in its entirety.

FIELD OF THE INVENTION

The present invention relates generally to wireless transceivers. More particularly, the present invention relates to output power control in the transmit path of a wireless transceiver.

BACKGROUND OF THE INVENTION

Wireless devices have been in use for many years for enabling mobile communication of voice and data. Such devices can include mobile phones and wireless enabled personal digital assistants (PDA's) for example. The transmission and reception of voice and data information by the wireless device is conducted with a base station, and in accordance with a particular standard, such as the Global System for Mobile Communications (GSM) standard.

The GSM standard dictates that wireless devices must transmit power at a specific power level. Therefore, the wireless device transmit circuits must ensure that the output power is constantly maintained at the specified power level, which is nominally 33 dB with a tolerance of plus or minus 1 dB for the GSM standard. Future standards may impose a constant output power level that is other than 33 dB. In the wireless device, a wireless transceiver chip includes both a receive core for receiving voice and data signals from the base station and a transmitter core for sending voice and data signals to the base station. One of the problems with maintaining a constant transmit power output level is that the circuits of the transmitter core will have performance that varies over temperature and process technology. For example, if the temperature of the wireless device exceeds a nominal operating temperature, then characteristics such as the output power can change. Semiconductor manufacturing process variation is a factor which can change the expected output power.

There are known techniques for correcting the output power level due to temperature and process variation effects. This includes both open loop and closed loop techniques. FIG. 1 is a block diagram showing a wireless device 10 having a closed loop power sensing scheme for regulating output power. Wireless device 10 includes a wireless transceiver 12 coupled to other discrete components used in the wireless input/output path, such as power amplifier 14, antenna switch 16 and antenna 18. The wireless transceiver 12 includes a transmitter core consisting of baseband to RF converter 20 and a variable gain amplifier 22, and a receive core 24. The baseband to RF converter 20 receives a digital signal from a base band processor, or microprocessor (not shown) of the wireless device 10, and executes well known signal processing operations to upconvert and prepare the signal for transmission. The variable gain amplifier 22 is set to provide a predetermined gain for the signal to be transmitted, usually with a gain control signal provided by the base band processor. The receive core 24 executes well known signal processing operations to downconvert and prepare the received signal for the base band processor.

The variable gain amplifier 22 is a circuit that is subject to process and temperature variation. For example, the output power of the variable gain amplifier 22 can shift by as much as 7 dBm, which is then further amplified by power amplifier 14. It is noted that the power amplifier 14 itself is subject to process and temperature variation. Therefore, to correct for these variations, a power corrector 26 is included for detecting the output power level of the power amplifier 14, and feeding back a correction signal to the power amplifier 14 for either increasing or decreasing the output power to meet the specified target level. This technique is sufficient for standards that require fixed output power levels, but then limits the wireless devices to that specific standard. Those skilled in the art will understand that other wireless communications standards will require that output power to be variable.

Typically, the base station in communication with the wireless device will instruct the wireless device to increase the gain for transmission, since the previously transmitted signals may have been detected as being sub-optimal. Those of skill in the art will understand that the request from the base station is embedded within the communication signal being transmitted to the wireless device. This increase can be specified as being a 10 dB increase, for example. Alternately, the base station can instruct the wireless device to reduce gain, in order to conserve battery power of the wireless device while maintaining optimal performance. Therefore, the closed loop power correcting system shown in FIG. 1 cannot be used for standards required variable power output.

One solution for correcting variable power output changes due to temperature is to set the gain in response to a sensed temperature. Most wireless devices usually include a temperature sensor for monitoring a temperature of the circuit board. Therefore, the final gain of the variable gain amplifier is characterized over different temperatures and the appropriate gain control signal is stored in memory. Table 1 is an example illustrating the type relational information that is stored in memory.

TABLE 1

| T1 | T2 | T3 | |
|---|---|---|---|
| Code 1 | Code 2 | Code 3 | Gain 1 |
| Code 4 | Code 5 | Code 6 | Gain 2 |
| Code 7 | Code 8 | Code 9 | Gain 3 |

In response to a sensed temperature (T1, T2 or T3) during use and a desired gain (Gain 1, Gain 2, Gain 3) to provide the desired final output power, the appropriate code is obtained from memory and applied to the variable gain amplifier. As shown in Table 1, in order to obtain the gain level of "Gain 1", different codes are used for sensed temperatures T1, T2 and T3. These temperatures can either be specific values or temperatures ranges for which the specific code is still valid. This is referred to as an open loop power correction system since the output power itself is not monitored in order to correct it. The problem with this system is that no accounting for process variation is provided because the characterized data is based on a nominal manufactured transceiver circuit. In order to account for process variation, each transceiver circuit should be characterized and have their own codes stored in memory. It should be apparent to persons skilled in the art that characterization of each wireless device requires significant amounts of time.

The wireless device 50 of FIG. 2 provides a closed loop solution for correcting variable power output. Wireless device 50 includes the same components shown in FIG. 1, except FIG. 2 replaces power corrector 26 with a power detector 52. Now, the output power is detected and sent to the base band processor. A characterization table can be included in memory of the base band processor for setting the appropriate gain in response to the sensed output power. The main problem with this solution is that the power detector is a discrete device whose characteristics will vary with temperature as well. Therefore, characterization of the power detector is required, and the data stored will be stored in memory with the power characterization data. Another problem is that the base band processor will require an auxiliary analog to digital converter for converting the detected output power into a digital signal.

Complicating the power output correction issue is the requirement for power ramping of the signal to be transmitted. Standards and governmental regulations in some areas require that the power level of the signal to be transmitted be ramped from a low power level to the maximum power level at the beginning of a transmission, and from the maximum power level to the low power level at the end of a transmission, as dictated by the particular standard. It is noted that the ideal ramping profile is different for different power levels. FIG. 3 illustrates an example power ramping profile of a signal between time t1 and t2. The ideal ramping curve 60 is to follow a raised cosine curve, and should be completed by time t2. Unfortunately, temperature can change the ramping profile such that ramping will either be too fast or too slow. A slow ramping of power results in insufficient data being sent to the base station as ramping has intruded into the data transmission time. Too fast and too much data is spuriously transmitted into the air, which may violate certain governmental regulations, or specifications set by one or more wireless standards. Therefore, additional ramping correction information must be stored in the base band processor.

Since full characterization of each assembled wireless device is too onerous a task, a single nominal wireless device is fully characterized to generate the appropriate codes for controlling the components of the transmitter core for correcting the output power and ramping profiles. Then subsequent devices have their output power tested and benchmarked against the nominal device. If there is variance in the output power relative to the nominal device, a compensation factor is applied to the codes of the table and then stored in memory. While this may reduce characterization time per wireless device, accuracy will be poor.

It is, therefore, desirable to provide a wireless device having a closed loop output power correction system with high accuracy while using minimal additional circuits and memory storage.

SUMMARY OF THE INVENTION

It is an object of the present invention to obviate or mitigate at least one disadvantage of previous closed loop power output correction systems.

In a first aspect, the present invention provides wireless transceiver having a receiver core coupled to a power amplifier. The wireless transceiver including power detection circuitry, analog to digital conversion circuitry, a power signal processor and a power correction circuit. The power detection circuitry is coupled to an output of the power amplifier for providing a detected power level and a reference power level. The analog to digital conversion circuitry converts the detected power level into a digital power level and converts the reference power level into a digital reference power level. The power signal processor subtracts the digital reference power level from the digital power level, and provides a feedback power signal corresponding to the difference between the digital power level and the digital reference power level. The power correction circuit provides a gain control signal corresponding to a difference between a variable power level signal and the feedback power signal. A transmit core of the wireless transceiver adjusts an output gain in response to the power control signal. In an embodiment of the present aspect, the power detection circuitry includes a first power detector and a second power detector. The first power detector is coupled to an output of the power amplifier for providing the detected power level. The second power detector is identically configured to the first power detector for providing the detected reference power level in response to a reference signal. In an aspect of the present embodiment, the power signal processor includes a digital subtractor for subtracting distortion noise associated with the second power detector from the detected power level. The power correction circuit includes a gain circuit and a sample and hold register. The gain circuit determines a difference between the variable power level signal and the feedback power signal, and generates the power control signal to correspond to the variable power level signal adjusted by the difference. The sample and hold register passes the power control signal during a power calibration period, and latches the power control signal at the end of the power calibration period.

According to an embodiment of the first aspect, the analog to digital conversion circuitry includes a first analog to digital converter and a second analog to digital converter. The first analog to digital converter is located in the receiver core for converting the detected power level into the digital power level. The second analog to digital converter is located in the receiver core for converting the reference power level into the digital reference power level. The first switch selectively couples the first analog to digital converter to the detected power level. The second switch selectively couples the second analog to digital converter to the detected reference power level. The receiver core includes third switch for selectively coupling the digital power level to the power signal processor, and fourth switch for selectively coupling the digital reference power level to the power signal processor.

In another embodiment of the present aspect, the variable power level signal corresponds to a desired power level of the power amplifier set by a base station. The transmit core includes a digital variable gain amplifier for adjusting the output gain in response to the power control signal. In an alternate embodiment, the variable power level signal has a predetermined ramping profile. The transmit core includes a digital gain unit, analog base band circuitry, and a digital variable gain amplifier. The digital gain unit multiplies a digital output signal with the power control signal to provide a pre-amplified digital output signal. The analog base band circuitry provides an analog output signal corresponding to the pre-amplified digital output signal. The digital variable gain amplifier amplifies the analog output signal to provide an amplified analog output signal with the output gain corresponding to a predetermined power level signal. In yet another embodiment of the first aspect, a power ramp controller is included for generating the variable power level signal in response to a predetermined power ramp profile signal and a power offset signal. The power ramp controller includes a look up table, an interpolation filter and an adder. The look up table stores a plurality of power ramp profiles, and selectively provides the predetermined power ramp profile signal. The interpolation filter filters the power ramp profile signal to provide a filtered power ramp profile signal. The adder adds a power value of the power offset signal to the filtered power ramp profile signal. The look up table can selectively provide the predetermined power ramp profile signal in response to a sensed temperature.

In the embodiment where the variable power level signal has a predetermined ramping profile, the power correction circuit includes a gain circuit and sampling circuitry. The gain circuit determines a difference between the variable power level signal and the feedback power signal, and generates the power control signal to correspond to the variable power level signal adjusted by the difference. The sampling circuitry passes the difference signal as the power control signal during a power calibration period, and latches the power control signal at the end of the power calibration period. The power control signal includes of a set of most significant bits and a set of least significant bits. The sampling circuitry includes a sample and hold circuit for passing the power control signal in response to a first logic state of an enable signal, and for latching the power control signal in response to a second logic state of the enable signal. The sampling circuitry includes a digital ramp circuit for encoding the difference signal into the power control signal, where the power control signal includes the set of most significant bits and the set of least significant bits. The transmit core can include a digital gain unit, analog base band circuitry and a digital variable gain amplifier. The digital gain unit amplifies a digital output signal by a value corresponding to the set of most significant bits to provide a pre-amplified digital output signal. The analog base band circuitry provides an analog output signal corresponding to the pre-amplified digital output signal. The digital variable gain amplifier amplifies the analog output signal to provide an amplified analog output signal with the output gain corresponding to a combination of a set power level signal and the set of least significant bits. The set power level signal adjusts a coarse gain level of the digital variable gain amplifier and the set of least significant bits adjusts a fine gain level of the digital variable gain amplifier.

In a second aspect, the present invention provides a wireless device having a power amplifier and a wireless transceiver. The power amplifier is coupled to an antenna. The wireless transceiver is coupled to a power amplifier, and includes a transmit core, power detection circuitry, a receiver core, a power signal processor and a power correction circuit. The transmit core provides an output radio frequency signal having an output gain in response to a gain control signal, the output radio frequency signal being provided to the power amplifier. The power detection circuitry is coupled to an output of the power amplifier for providing a detected power level and a reference power level. The receiver core has analog to digital conversion circuitry for converting the detected power level into a digital power level and for converting the reference power level into a digital reference power level. The power signal processor subtracts the digital reference power level from the digital power level, and provides a feedback power signal corresponding to the difference between the digital power level and the digital reference power level. The power correction circuit provides the gain control signal corresponding to a difference between a variable power level signal and the feedback power signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a closed loop power output calibration system for variable power output wireless devices. The wireless device includes a wireless transceiver having a transmit core coupled to a discrete power amplifier. Power detection circuitry formed in the wireless transceiver provides a detected power level of the power amplifier, and a reference power level, both of which are converted to digital signals using existing I and Q signal analog to digital converters in the receiver core. The digital signals are processed to cancel power distortion and temperature effects to provide a resulting power feedback signal. The power feedback signal is compared to gain signals corresponding to a desired power output level, and corrective control signals are generated. The corrective control signals can adjust the gain of a variable gain amplifier coupled to the power amplifier, and/or the gain of an input signal prior to amplification by the variable gain amplifier for maintaining the target output power level from the wireless device.

Figure 1:
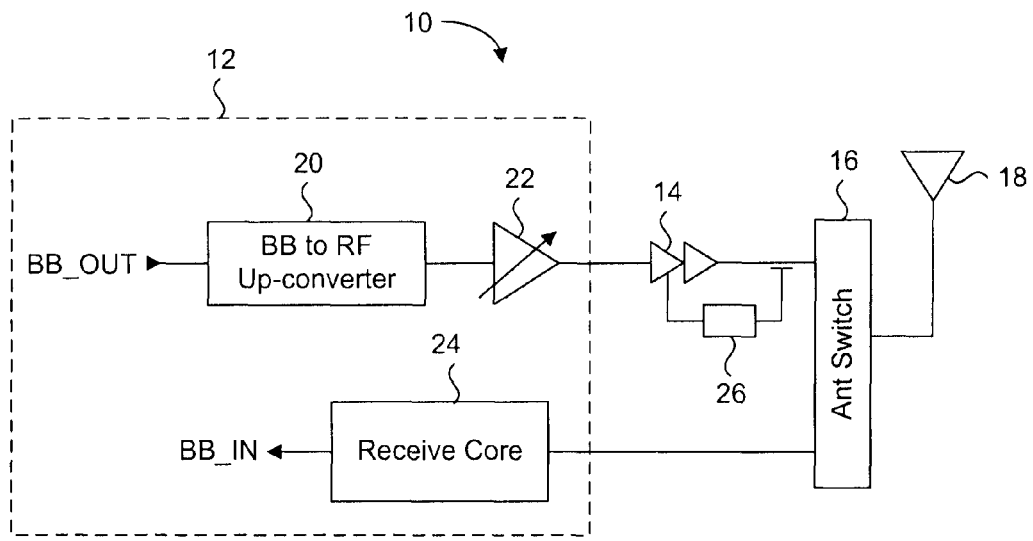
FIG. 1 is a block diagram of a prior art wireless device with a constant output power correction system.
Figure 2:
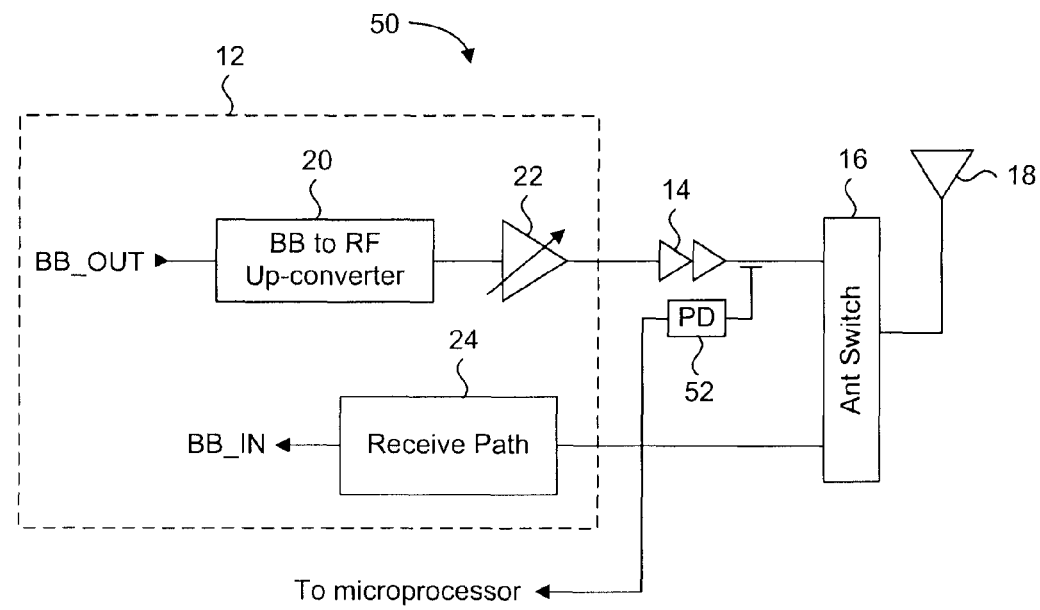
FIG. 2 is a block diagram of a prior art wireless device with a variable output power correction system.
Figure 3:
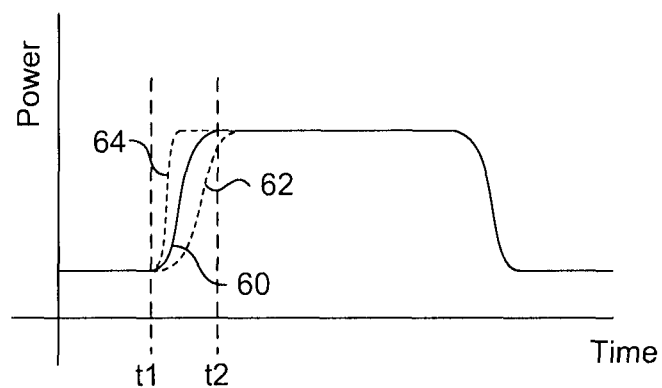
FIG. 3 is a graph illustrating power ramping curves for wireless signal transmission.
Figure 4:
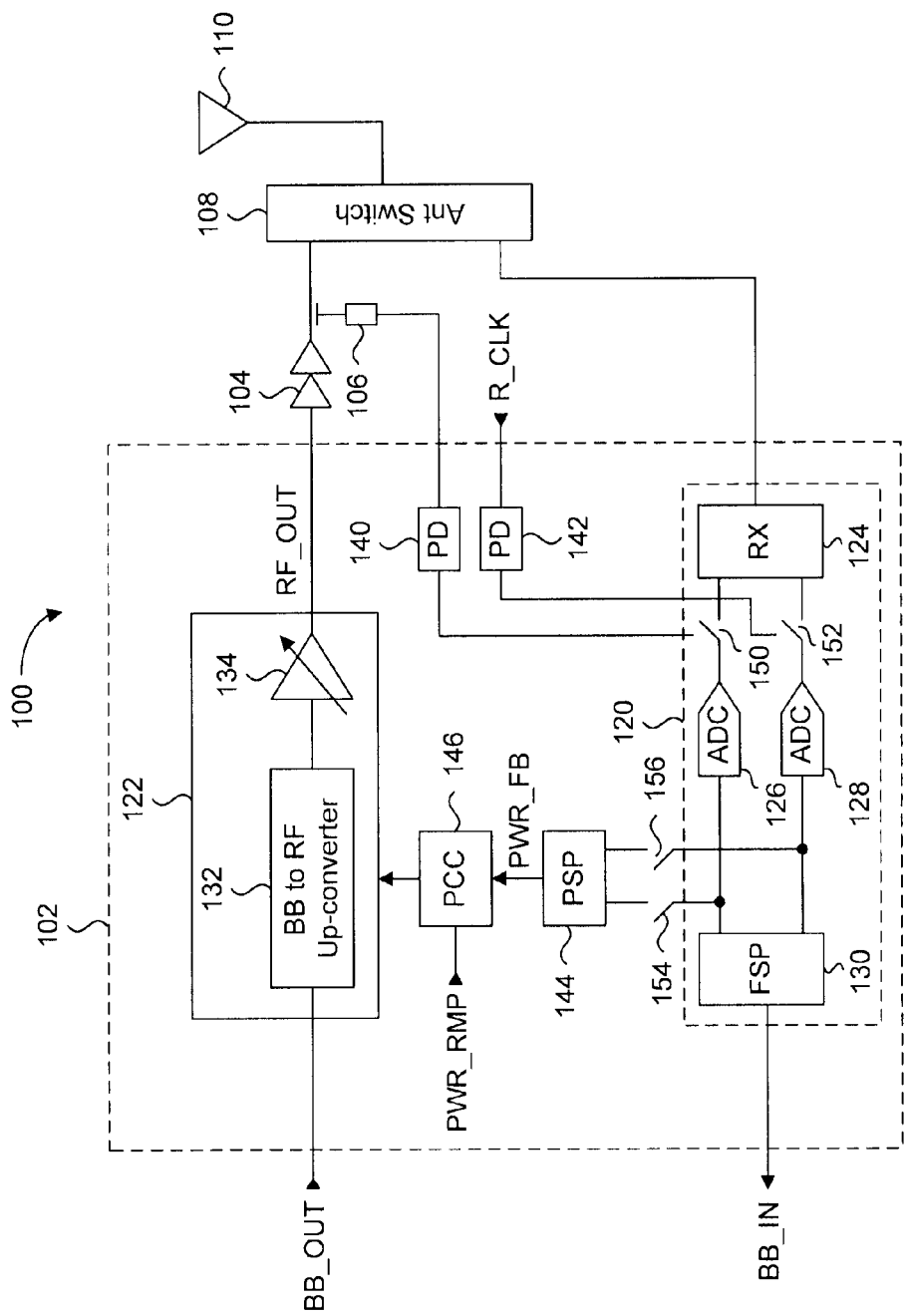
FIG. 4 is a block diagram of a closed loop variable output power correction system for a wireless device, according to an embodiment of the present invention.

FIG. 4 is a block diagram of a closed loop variable output power correction system for a wireless device, according to an embodiment of the present invention. The wireless device 100 of FIG. 4 is embodied as a circuit board that includes a wireless transceiver chip 102, and discrete components such as power amplifier 104, attenuator 106, antenna switch 108 and antenna 110. To implement the closed loop variable output power correction system, the only modification to the configuration of the discrete components is the inclusion of the optional attenuator 106, for reducing the power being fed back into the wireless transceiver 102. The wireless transceiver 102 can include an integrated attenuator. The wireless transceiver 102 includes two main circuit blocks that are required for transmission and reception of RF signals. First is the receiver core 120, and second is the transmitter core 122. The receiver core 120 includes a receiver down conversion and demodulation block 124, analog to digital converters 126 and 128, and a signal processing block 130. The receiver down conversion and demodulation block 124 receives an RF input signal and generates separate I and Q signals. The analog to digital converters 126 and 128 convert the I and Q signals into digital signals, which are subsequently filtered and processed by signal processing block 130 into a digital input signal BB_IN for the base band processor (not shown).

The transmitter core 122 includes a base band to radio frequency (RF) up converter 132 and a digitally controlled variable gain amplifier 134. The up converter 132 will include signal processing logic such as pulse shaping circuits, digital to analog converters, filters and I/Q modulation circuits for preparing the base band processor digital output signal BB_OUT for transmission. The variable gain amplifier 134 of the present embodiment is digitally controlled in response to one or more gain control signals. Within wireless transceiver 102, the closed loop correction system includes power detection circuitry implemented as a pair of power detectors 140 and 142, the analog to digital conversion circuitry in the receiver core 120, a power signal processing circuit 144, and a power correction circuit 146. The re-use of existing analog to digital conversion circuitry of the receiver core 120, namely analog to digital converters 126 and 128, obviates the need to include additional dedicated analog to digital converters, thereby saving chip area. In the present embodiment, the receiver core data signal path will include a first pair of switches 150 and 152 for selectively coupling the inputs of analog to digital converters 126 and 128 to either power detectors 140 and 142 or to receiver down conversion and demodulation block 124. Similarly, a second pair of switches 154 and 156 selectively couples the outputs of analog to digital converters 126 and 128 to either the power signal processing circuit 144 or to the signal processing block 130.

The general function of the aforementioned components of the closed loop correction system is now described. During a power calibration period when the receiver core is not in use, switches 150, 152, 154 and 156 are set to couple the inputs and outputs of the analog to digital converters 126 and 128 to the circuits of the closed loop correction system. The power detector 140 provides a detected power level corresponding to the output of power amplifier 104, via optional attenuator 106. Reference power detector 142 being identical to power detector 140, receives a reference signal such as a 26 MHz reference clock R_CLK with constant amplitude and provides a reference power level. Alternately, the reference signal can be provided by a phase locked loop (PLL) or a non-oscillating reference voltage. This is used later for cancelling the effect of non-idealities and temperature variations of power detector 140 since reference power detector 142 is fabricated on the same chip and will thus vary in the same was as power detector 140. The analog detected power level from power detector 140 is converted into a digital power level by analog to digital converter 126, while the reference power level from reference power detector 142 is converted into a digital reference power level by analog to digital converter 128. The power signal processing circuit 144 subtracts the digital reference power level from the digital power level to provide a feedback power signal PWR_FB corresponding to the difference. Accordingly, power signal processing circuit 144 can be implemented as a digital subtractor, implementations thereof which are known in the art. This feedback power signal corresponds to the digital power level that is free from distortion or temperature effects of the power detector 140.

The power correction circuit 146 receives the feedback power signal PWR_FB and a variable power level signal PWR_RMP. Signal PWR_RMP corresponds to either a predetermined fixed power level or a predetermined ramping profile, which has a variable power level that follows a predetermined ramping profile, such as a raised cosine curve or any other type of curve. In response to a difference between PWR_RMP and PWR_FB, the power correction circuit 146 will provide a gain control signal that will compensate or correct for the difference between PWR_RMP and PWR_FB by adjusting gain characteristics in circuits of the transmitter core 122. In the present embodiment, power correction circuit 146 includes a gain circuit that generates the gain control signal. In an ideal initial situation, PWR_FB will match PWR_RMP. Therefore the gain level corresponding to PWR_RMP will be sufficient for maintaining the desired output power level. On the other hand for example, if the output of power amplifier 104 is too low, then power correction circuit 146 will increase the gain level of the gain control signal relative to that of PWR_RMP by an amount corresponding to the difference. On the other hand, if the output of power amplifier 104 is too high, then power correction circuit 146 will decrease the gain level of the gain control signal relative to that of PWR_RMP.

Figure 5:
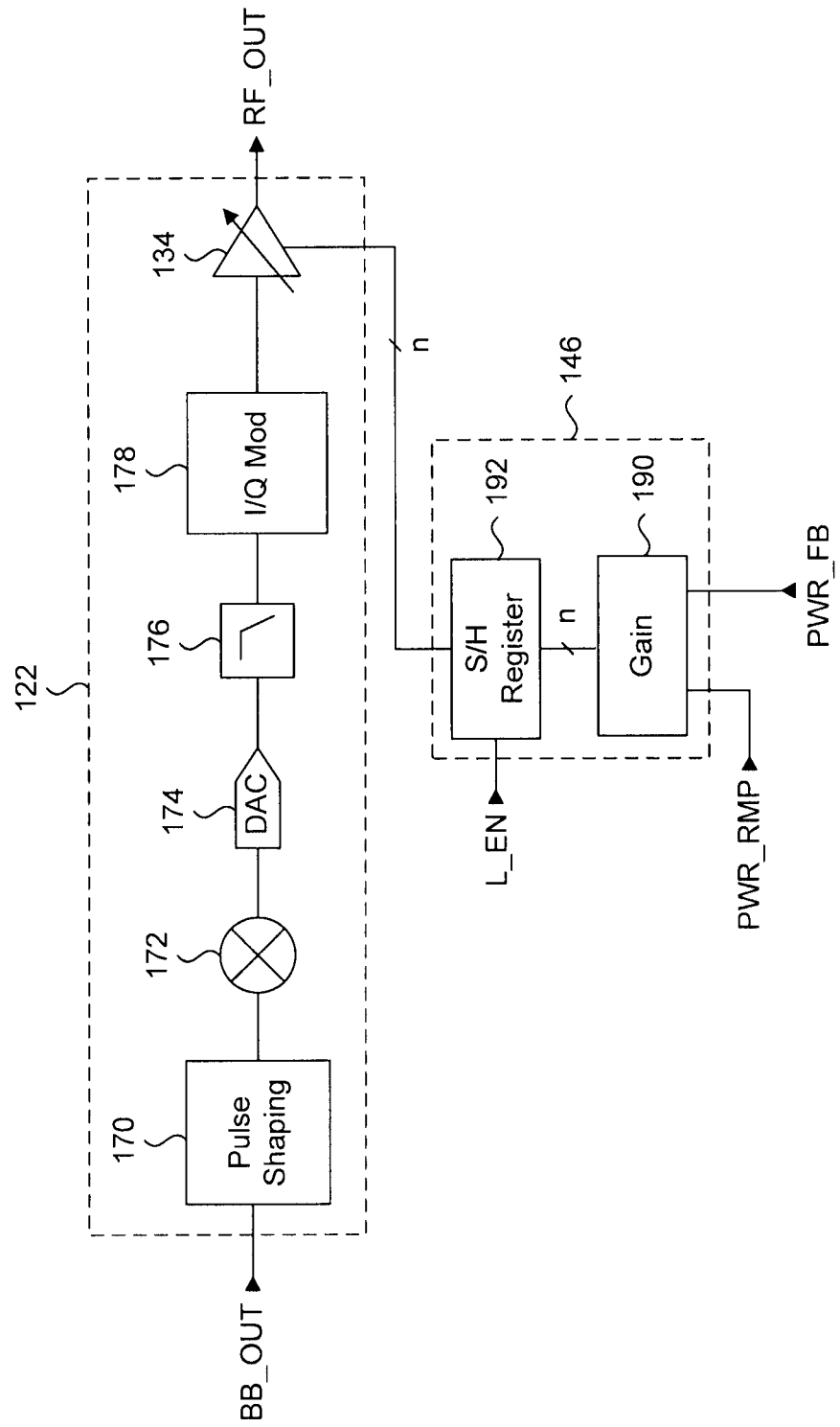
FIG. 5 is a block diagram showing details of the transmit core and power correction circuit shown in FIG. 4, with variable gain amplifier control according to an embodiment of the present invention.

FIG. 5 is a block diagram showing details of the transmitter core 122 and power correction circuit 146 shown in FIG. 4. FIG. 5 further illustrates an embodiment of direct variable gain amplifier control using the gain control signal generated by the power correction circuit 146, according to an embodiment of the present invention. The transmitter core 122 includes a pulse shaping circuit 170, a gain multiplier 172, a digital to analog converter 174, a filter 176, an I/Q modulator 178, and the previously shown digital variable gain amplifier 134. Components 170 and 172 are part of a digital base band circuit while components 174, 176 and 178 are part of an analog base band circuit. All these circuits are well known in the art. The multiplier can be controlled by an automatic gain control circuit to adjust the signal gain prior to digital to analog conversion. It is assumed for the present embodiment that the gain multiplier 172 is fixed in response to control signals from the base band processor. The power correction circuit 146 includes a gain circuit 190 for generating the gain control signal of n-bits in response to PWR_RMP and PWR_FB as previously described, and sampling circuitry 192 for passing and selectively latching the n-bits of the gain control signal in response to a logic state of an latch enable signal L_EN. As shown in FIG. 5, all n-bits of the gain control signal are provided to variable gain amplifier 134.

In the embodiment of FIG. 5, the ramping begins while L_EN is at an inactive logic level. As PWR_RMP provides a power ramping profile, it is compared to PWR_FB from the power amplifier 104 of FIG. 4. Therefore, adjustments are made to the gain control signal, thereby adjusting variable gain amplifier 134. When the ramping is complete, meaning that PWR_RMP has reached a level that results in the maximum output power level of power amplifier 104, L_EN switches to an active logic state for latching the last gain control signal from gain circuit 190. Therefore, variable gain amplifier 134 will now provide an RF_OUT signal having an adjusted gain sufficient for power amplifier 104 to drive the antenna at the target output power level. As will be discussed in the next embodiment, the ramping profile of PWR_RMP is provided by a look up table that stores preset profiles for different temperatures.

Figure 6:
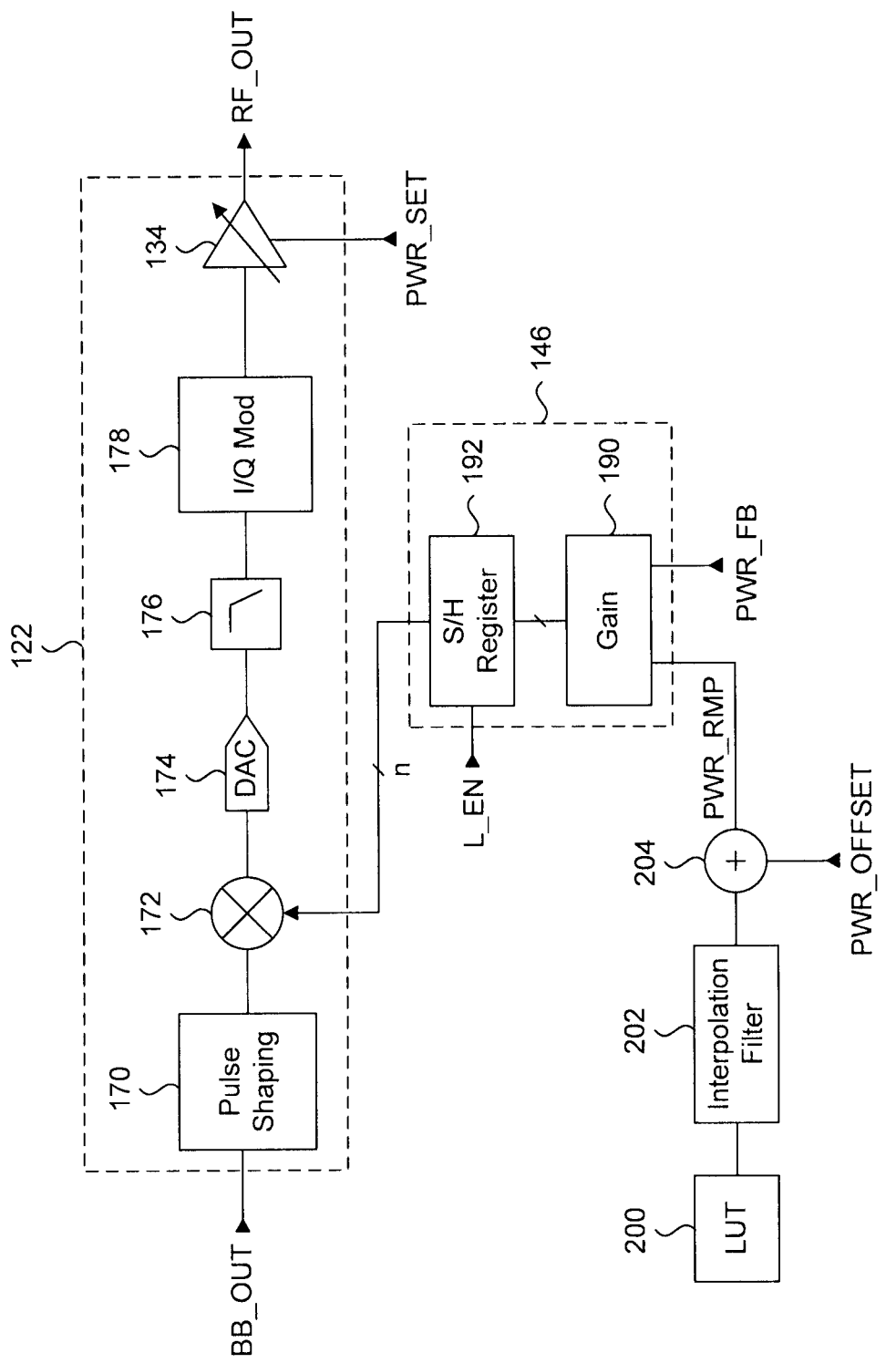
FIG. 6 is a block diagram showing details of the transmit core and power correction circuit shown in FIG. 4, according to another embodiment of the present invention.

FIG. 6 is a block diagram showing the same circuit elements of the transmitter core 122 and power correction circuit 146 shown in FIG. 5. FIG. 6 further illustrates an embodiment of direct gain multiplier control using the gain control signal generated by the power correction circuit 146, according to an embodiment of the present invention. More specifically, the output of sampling circuitry 192 is provided to gain multiplier 172, while variable gain amplifier 134 receives a preset power level signal PWR_SET. PWR_SET corresponds to a gain sufficient for power amplifier 104 to drive the antenna at the target output power level. Since PWR_SET is fixed, adjustments to the signal gain will be made earlier in the transmit signal chain at the gain multiplier to correct for temperature and process variation in the output power level of the power amplifier 104. FIG. 6 includes a power ramp controller consisting of a look up table 200 for generating a ramp profile, an interpolation filter 202 for filtering jitter in the signal from the look up table 200, and an adder 204 for shifting the ramp profile by a power offset value PWR_OFFSET. It should be understood that a plurality of ramp profiles can be stored in the look table from prior characterization across temperature, or for different power amplifiers that may have an optimal response to a particular ramp profile. Because most wireless devices have temperature sensors, this sensed temperature can be used to determine the appropriate ramping profile to use.

It is noted that adder 204 for shifting the ramp profile by PWR_OFFSET is an optional calibration feature, because different power amplifiers will have different response characteristics. More specifically, while a stored power ramping profile has a minimum level and a maximum level, the power amplifier may not respond until a higher than the minimum gain level is reached. Therefore, the ramp profile is shifted by an amount to ensure that the power amplifier responds to the minimum gain level. The PWR_OFFSET value can be obtained through simple testing and fixed for the wireless devices that use a specific manufacturer's power amplifier. Different power amplifiers can be tested, and registers can be loaded with corresponding codes to set PWR_OFFSET during manufacturing.

The resulting power ramp signal PWR_RMP is fed to an input of gain circuit 190 and compared to PWR_FB. Therefore during calibration operation, as PWR_RMP increases, it is compared to the real output power PWR_FB, and the gain control signal will be adjusted such that gain multiplier 172 provides a signal with the corrected gain to yield the target output power from power amplifier 104. In the embodiment of FIG. 6, gain multiplier 172 will be implemented as a digitally controlled amplifier that is responsive to the n signals from the sampling circuitry 192, which should be well known in the art. Persons skilled in the art will understand that the step size of the power ramp signal PWR_RMP should be optimized in order to minimize quantization noise, thereby minimizing the spectral radiation during ramp up or ramp down operations.

Figure 7:
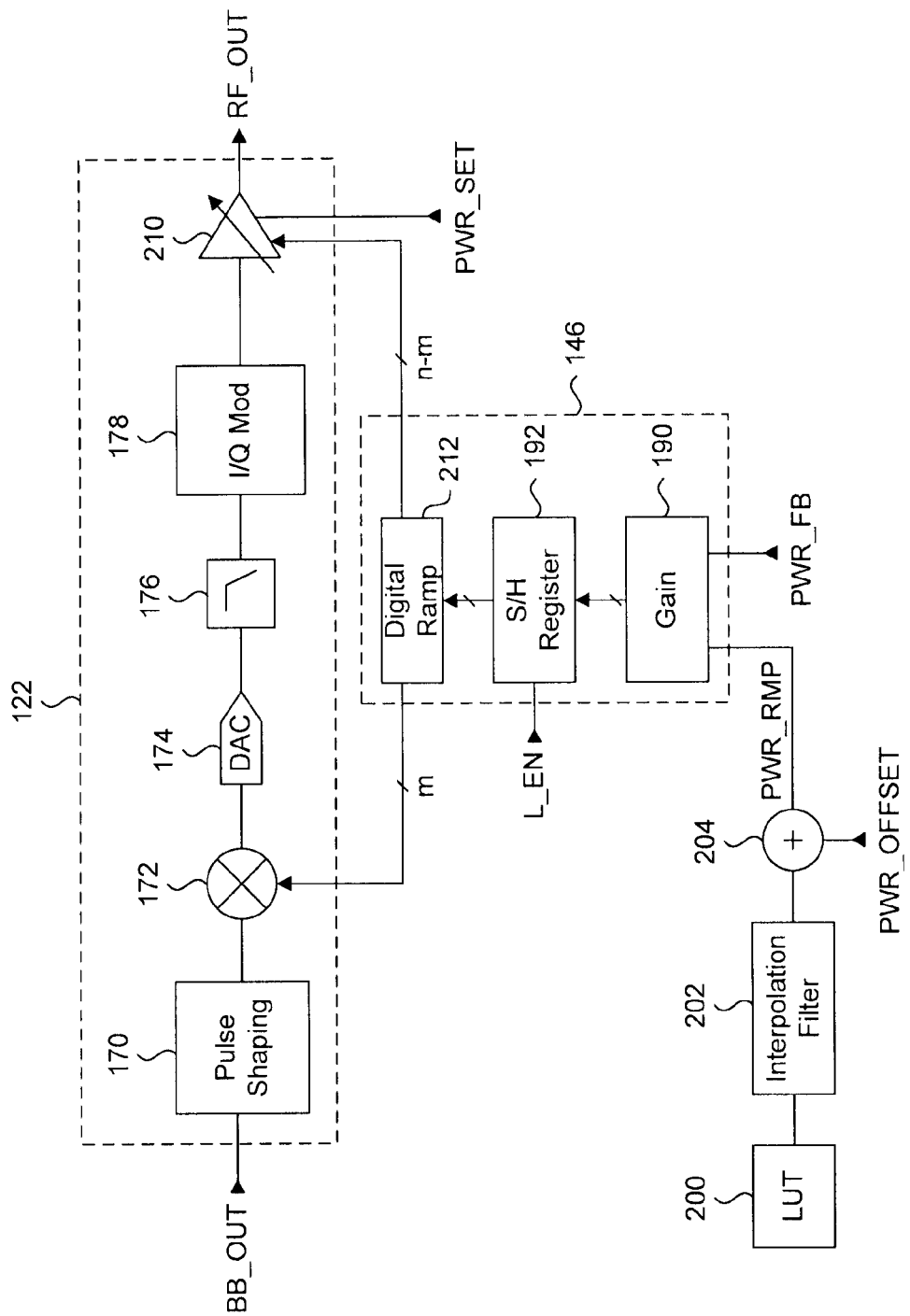
FIG. 7 is a block diagram showing details of the transmit core and power correction circuit shown in FIG. 4, according to a further embodiment of the present invention; and, FIG. 8 is a circuit schematic of a digital ramp circuit shown in FIG. 7.

FIG. 7 is a block diagram showing the same circuit elements of the transmitter core 122 and the power ramp controller elements shown in FIG. 6. Accordingly, their method of operation remains unchanged. FIG. 7 further illustrates an embodiment of a combination of direct gain multiplier control and direct variable gain amplifier control using the gain control signal generated by the power correction circuit 146, according to an embodiment of the present invention. In the present embodiment, different bits of the gain control signal are used to control different circuits of the transmitter core 122. The transmitter core 122 now includes a digital variable gain amplifier 210 that receives in addition to a preset power level signal PWR_SET, least significant bits of the gain control signal. Meanwhile, the gain multiplier 172 receives the most significant bits of the gain control signal. The division of least significant bits and most significant bits can be a design parameter of the system, selected based on the implemented circuits and desired level of performance and accuracy.

The power correction circuit 146 of the embodiment of FIG. 7 will include an additional digital ramp circuit 212. The digital ramp circuit 212 is responsible for decoding the digital output of sampling circuitry 192 into a gain control word having bits ordered from a most significant bit to a least significant bit. An example circuit embodiment of digital ramp circuit 212 will be shown later in FIG. 8.

The digital ramp circuit 212 provides a gain control signal n-bits wide, where n is an integer value greater than 1. The gain control signal is organized into two groupings, where the first is a set of most significant bits and the second is a set of least significant bits. Given an n-bit wide signal, the set of most significant bits can be m bits wide, therefore the set of least significant bits are n-m bits wide. The m most significant bits are provided to the gain multiplier 172 to provide coarse gain adjustment, while the n-m least significant bits are provided to the variable gain amplifier 210 to provide fine gain adjustment. In operation, PWR_SET is set at a predetermined level such that variable gain amplifier 210 will drive RF_OUT at approximately the desired output power level, based on an expected maximum gain of the signal to be transmitted. The m most significant bits of the gain control signal resulting from the feedback processing then set the gain applied to the pulse shaped BB_OUT signal by gain multiplier 172. The n-m least significant bits then fine tune the variable gain amplifier 210 to ensure that the maximum output power level of the power amplifier 104 is at the desired level.

It is noted that the variable gain amplifier 210 is configured to be digitally controlled in a weighted manner corresponding to the logical position the control bits it receives. For example, PWR_SET can be a number of most significant bits for coarsely setting the gain, while the n-m bits of the gain control signal form the remaining least significant bits are used for fine control of the gain.

Figure 8:
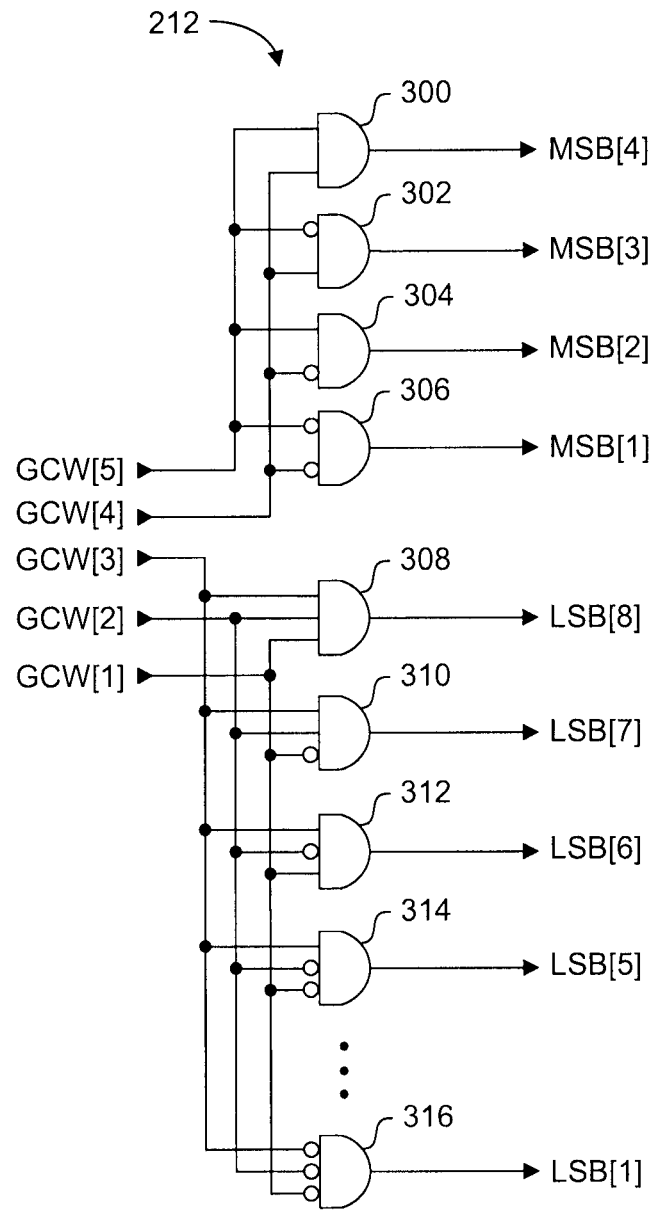

FIG. 8 is an example circuit illustrating a possible implementation of the digital ramp circuit 212 of FIG. 7. It is assumed that the gain multiplier 172 is configured to adjust gain in large step sizes, such as 1 or 2 dB step sizes for example, while digital variable gain amplifier is configured to adjust gain in small step sizes, such as 0.5 or 0.2 dB step sizes for example. The example digital ramp circuit 212 receives a 5 bit gain level signal GCW[1] to GCW[5] from the sampling circuitry 192, and decodes the bits to provide a 12 bit gain control signal. The 12 bit gain control signal is logically subdivided into a set of most significant bits MSB[1] to MSB[4], and a set of least significant bits LSB[1] to LSB[8], where MSB[4] is the most significant bit and LSB[1] is the least significant bit of the gain control signal. The digital ramp circuit 212 of FIG. 8 is implemented as a decoder circuit consisting of two-input AND logic gates 300, 302, 304, and 306, and three-input AND logic gates 308, 310, 312, 314, and 316. It is noted that the remaining AND logic gates between 314 and 316 are not shown. In the presently shown example configuration, AND logic gates 300, 302, 304, and 306 will decode signals GCW[4] and GCW[5] to provide one active high logic level output, while AND logic gates 308, 310, 312, 314 and 316 will decode signals GCW[1] to GCW[3] to provide one active high logic level output. Therefore, for large changes in the power, the higher significant bits GCW[4] and GCW[5] will cause gain multiplier 172 to make large step size changes to the gain. However, as the top of the ramp profile is reached, ie. near the maximum level, there will only be small changes to the gain.

Therefore, only signals GCW[1] to GCW[3] will change, thereby controlling digital variable gain amplifier 210 to make smaller changes to its gain. Persons skilled in the art will understand that the signal provided by the sampling circuitry 192 can be more than 5 bits, and the digital ramp circuit 212 can be configured to provide any number of least significant bits and most significant bits to suit the desired accuracy of the gain multiplier 172 and the digital variable gain amplifier 210.

Therefore, by accurately detecting the feedback power of the power amplifier on the wireless transceiver chip, and then digitally processing the result to generate a corrective gain control signal, the digitally controllable components of the wireless transceiver can be adjusted to compensate or correct for temperature and/or manufacturing variations of the wireless transceiver circuits. The reuse of existing circuits such as analog to digital converters in the receive core, in the feedback loop minimizes the amount of additional circuitry required to implement the feedback loop, thereby reducing chip size and therefore cost.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A wireless transceiver having a receiver core coupled to a power amplifier, comprising:
    power detection circuitry coupled to an output of the power amplifier for providing a detected power level and a reference power level;
    analog to digital conversion circuitry for converting the detected power level into a digital power level and for converting the reference power level into a digital reference power level; a power signal processor for subtracting the digital reference power level from the digital power level, and for providing a feedback power signal corresponding to the difference between the digital power level and the digital reference power level; and,
    a power correction circuit for providing a power control signal corresponding to a difference between a variable power level signal and the feedback power signal, a transmit core of the wireless transceiver adjusting an output gain in response to the power control signal.

2. The wireless transceiver of claim 1, wherein the power detection circuitry includes a first power detector coupled to the output of the power amplifier for providing the detected power level, and a second power detector identically configured to the first power detector for providing the detected reference power level in response to a reference signal.

3. The wireless transceiver of claim 1, wherein the analog to digital conversion circuitry includes a first analog to digital converter in the receiver core for converting the detected power level into the digital power level, and a second analog to digital converter in the receiver core for converting the reference power level into the digital reference power level.

4. The wireless transceiver of claim 3, wherein the receiver core includes a first switch for selectively coupling the first analog to digital converter to the detected power level, and a second switch for selectively coupling the second analog to digital converter to the detected reference power level.

5. The wireless transceiver of claim 4, wherein the receiver core includes a third switch for selectively coupling the digital power level to the power signal processor, and a fourth switch for selectively coupling the digital reference power level to the power signal processor.

6. The wireless transceiver of claim 2, wherein the power signal processor includes a digital subtractor for subtracting distortion noise associated with the second power detector from the detected power level.

7. The wireless transceiver of claim 2, wherein the power correction circuit includes a gain circuit for determining a difference between the variable power level signal and the feedback power signal, the gain circuit generating the power control signal to correspond to the variable power level signal adjusted by the difference, and a sample and hold register for passing the power control signal during a power calibration period, and for latching the power control signal at the end of the power calibration period.

8. The wireless transceiver of claim 1, wherein the variable power level signal corresponds to a desired power level of the power amplifier set by a base station.

9. The wireless transceiver of claim 1, wherein the transmit core includes a digital variable gain amplifier for adjusting the output gain in response to the power control signal.

10. The wireless transceiver of claim 1, wherein the variable power level signal has a predetermined ramping profile.

11. The wireless transceiver of claim 1, wherein the transmit core includes a digital gain unit for multiplying a digital output signal with the power control signal to provide a pre-amplified digital output signal, analog base band circuitry for providing an analog output signal corresponding to the pre-amplified digital output signal, and a digital variable gain amplifier for amplifying the analog output signal to provide an amplified analog output signal with the output gain corresponding to a predetermined power level signal.

12. The wireless transceiver of claim 1, further including a power ramp controller for generating the variable power level signal in response to a predetermined power ramp profile signal and a power offset signal.

13. The wireless transceiver of claim 12, wherein the power ramp controller includes a look up table for storing a plurality of power ramp profiles, the look up table selectively providing the predetermined power ramp profile signal, an interpolation filter for filtering the predetermined power ramp profile signal to provide a filtered power ramp profile signal, and an adder for adding a power value of the power offset signal to the filtered power ramp profile signal.

14. The wireless transceiver of claim 13, wherein the look up table selectively provides the predetermined power ramp profile signal in response to a sensed temperature.

15. The wireless transceiver of claim 1, wherein the power correction circuit includes a gain circuit for determining a difference between the variable power level signal and the feedback power signal, the gain circuit generating the power control signal to correspond to the variable power level signal adjusted by the difference, and sampling circuitry for passing the difference signal as the power control signal during a power calibration period, and for latching the power control signal at the end of the power calibration period, the power control signal includes a set of most significant bits and a set of least significant bits.

16. The wireless transceiver of claim 15, wherein the sampling circuitry includes a sample and hold circuit for passing the power control signal in response to a first logic state of an enable signal, and for latching the power control signal in response to a second logic state of the enable signal.

17. The wireless transceiver of claim 16, wherein the sampling circuitry includes a digital ramp circuit for encoding the difference signal into the power control signal, the power control signal including the set of most significant bits and the set of least significant bits.

18. The wireless transceiver of claim 15, wherein the transmit core includes a digital gain unit for amplifying a digital output signal by a value corresponding to the set of most significant bits to provide a pre-amplified digital output signal, analog base band circuitry for providing an analog output signal corresponding to the pre-amplified digital output signal, and a digital variable gain amplifier for amplifying the analog output signal to provide an amplified analog output signal with the output gain corresponding to a combination of a set power level signal and the set of least significant bits, the set power level signal adjusting a coarse gain level of the digital variable gain amplifier and the set of least significant bits adjusting a fine gain level of the digital variable gain amplifier.

19. A wireless device comprising:
a power amplifier coupled to an antenna; and,
a wireless transceiver coupled to the power amplifier, the wireless transceiver including a transmit core for providing an output radio frequency signal having an output gain in response to a gain control signal, the output radio frequency signal being provided to the power amplifier, power detection circuitry coupled to an output of the power amplifier for providing a detected power level and a reference power level;

a receiver core having analog to digital conversion circuitry for converting the detected power level into a digital power level and for converting the reference power level into a digital reference power level;

a power signal processor for subtracting the digital reference power level from the digital power level, and for providing a feedback power signal corresponding to the difference between the digital power level and the digital reference power level, and a power correction circuit for providing the gain control signal corresponding to a difference between a variable power level signal and the feedback power signal.

\* \* \* \* \*